(12) United States Patent
Thielman et al.

(10) Patent No.: US 6,725,169 B2
(45) Date of Patent: Apr. 20, 2004

(54) METHODS AND APPARATUS FOR AUTOMATIC GAIN CONTROL

(75) Inventors: Leroy O. Thielman, Shoreview, MN (US); Stanley A. White, San Clemente, CA (US)

(73) Assignee: Honeywell International Inc., Morristown, NJ (US)

( * ) Notice: Subject to any disclaimer, the term of this patent is extended or adjusted under 35 U.S.C. 154(b) by 40 days.

(21) Appl. No.: 10/092,457

(22) Filed: Mar. 7, 2002

(65) Prior Publication Data

US 2003/0171882 A1 Sep. 11, 2003

(51) Int. Cl.[7] ................... G01C 19/00; G01C 15/00
(52) U.S. Cl. ..................... 702/104; 702/60; 702/65; 702/92; 702/107; 73/488; 73/504.02; 73/504.12
(58) Field of Search ..................... 702/60, 65, 92, 702/104, 107; 324/600; 73/488, 504.02, 504.12

(56) References Cited

U.S. PATENT DOCUMENTS

| 3,682,003 A | 8/1972 | Sage et al. |
|---|---|---|
| 3,967,102 A | 6/1976 | McCown |
| 3,974,699 A | 8/1976 | Morris et al. |
| 4,234,842 A | 11/1980 | Brennen et al. |
| 4,328,591 A | 5/1982 | Baghdady |
| 4,410,764 A | 10/1983 | Werth et al. |
| 4,431,976 A | 2/1984 | Voorman |
| 4,495,643 A | 1/1985 | Orban |
| 4,534,043 A | 8/1985 | Krishnan |
| 4,654,663 A | 3/1987 | Alsenz et al. |
| 4,789,952 A | 12/1988 | Lo et al. |
| 4,802,766 A | 2/1989 | Lundeen et al. |
| RE32,931 E | 5/1989 | Staudte |
| 4,843,583 A | 6/1989 | White et al. |
| 4,899,587 A | 2/1990 | Staudte |
| 5,056,366 A | 10/1991 | Fersht et al. |
| 5,097,218 A | 3/1992 | Cooper |
| 5,193,371 A | 3/1993 | Yamane |
| 5,331,299 A | 7/1994 | Smith |
| 5,412,472 A | 5/1995 | Okada et al. |
| 5,471,396 A | 11/1995 | White |
| 5,576,976 A | 11/1996 | White |
| 5,675,498 A | 10/1997 | White |
| 5,893,054 A | 4/1999 | White |

FOREIGN PATENT DOCUMENTS

| EP | 0 631 371 A2 | 6/1994 |
|---|---|---|
| WO | WO 90/05970 | 5/1990 |
| WO | WO 03/019782 A2 | 3/2003 |

OTHER PUBLICATIONS

S. Gibilisco, "Handbook of Radio and Wireless Technology," McGraw–Hill 1998, pp. 244,252,543,549.
M.S. Roden, "Analog and Digital Communication Systems," Prentice–Hall 1991, p. 193.
L.R. Rabiner and B. Gold, "Theory and Application of Digital Signal Processing," Prentice–Hall 1975, p. 680.

*Primary Examiner*—John Barlow
*Assistant Examiner*—Meagan S Walling
(74) *Attorney, Agent, or Firm*—Matthew Luxton, Esq.; Armstrong Teasdale LLP

(57) ABSTRACT

An apparatus for controlling an amplitude of a signal generated from a digitized sinusoid of rapidly and widely varying amplitude is described herein. The apparatus includes a two stage gain adjuster which produces a gain adjusted signal, a phase shifter which converts the gain adjusted signal into two gain adjusted output signals separated in phase by 90 degrees, a power estimation unit to estimate the power of the gain adjusted signal, and an adjusting unit to adjust a gain of the gain adjuster according to a power estimate from the power estimation unit and a desired output signal power.

41 Claims, 8 Drawing Sheets

METHODS AND APPARATUS FOR AUTOMATIC GAIN CONTROL

BACKGROUND OF THE INVENTION

This invention relates generally to rate sensing systems, and more particularly, to gyro motors and start up sequences for gyro motors.

During a startup phase of certain known gyro motors, a transient signal such as a pulse or a noise burst is used to excite the very lightly damped motor structure of the gyro motor. The motor responds with a very small and slowly decaying sinusoidal pick-off signal. This pick-off signal is typically applied to a gain circuit, which applies a large gain to the pick-off signal in an attempt to provide a constant amplitude sinusoidal signal to a motor control loop. The motor control loop tries to acquire the sinusoid signal with a phase-locked loop (PLL), which provides a motor drive signal at an appropriate frequency, magnitude, and phase. When the PLL "catches" and the correct motor drive signal is applied, the amplitude of the motor pick-off signal suddenly increases by orders of magnitude, and can overwhelm an analog-to-digital converter (ADC) in the motor control loop. Therefore, in known motor control loops, the large variations in the pick-off signal prevent a constant amplitude sinusoidal signal from being generated.

BRIEF SUMMARY OF THE INVENTION

In one aspect, an apparatus for controlling an amplitude of a signal generated from a digitized sinusoid signal of rapidly and widely varying amplitude is provided. The apparatus comprises a two stage gain adjuster which produces a gain adjusted signal and a phase shifter which converts the gain adjusted signal into two gain adjusted output signals separated in phase by 90 degrees. The apparatus further comprises a power estimation unit to estimate the power of the gain adjusted signal and an adjusting unit to adjust a gain of the gain adjuster according to a power estimate from said power estimation unit and a desired output signal power.

In another aspect, a method for controlling the amplitude of a signal generated from a digitized sinusoid signal of rapidly and widely varying amplitude is provided. The method comprises producing a gain adjusted signal from the sinusoid signal utilizing a two stage gain adjuster and converting the gain adjusted signal into two gain adjusted output signals separated in phase by 90 degrees utilizing a phase shifter. The method also comprises estimating the power of the gain adjusted signal and adjusting the gain of the gain adjuster according to the estimated power and a desired output signal power.

In yet another aspect, a control circuit for a gyro is provided. The control circuit comprises a phase-locked loop configured to supply a motor control signal, and a motor signal conditioning circuit which converts the motor control signal to an analog motor drive signal. The phase-locked loop further comprises an analog-to-digital converter configured to receive a gyro pick-off signal, an automatic gain control circuit to provide amplitude control to an output of the analog-to-digital converter, and a numerically controlled digital dual frequency oscillator.

DETAILED DESCRIPTION OF THE INVENTION

An analog-to-digital converter (ADC) with a very wide dynamic operating range is driven by an analog signal (i.e. a gyro pick-off signal) source that produces a sinusoidal waveform whose amplitude envelope may vary over several orders of magnitude. The ADC output drives an automatic gain control (AGC) unit (described herein) which provides tightly amplitude controlled sinusoid and cosinusoid output waveforms to a phase detector of a phase-locked loop. The AGC is configured to hold the amplitudes of the output waveform envelopes to a value of one-half, despite the fact that the input envelope may vary rapidly over a wide range of values.

The AGC described herein provides signal processing required between the ADC and the phase detector in the PLL while maintaining a peak amplitude of one for all internal signals. In addition, the AGC uses simple, low cost fixed point processing. Internal signals are limited to an amplitude of unity, despite the extremely wide dynamic range of the AGC inputs.

Figure 1:
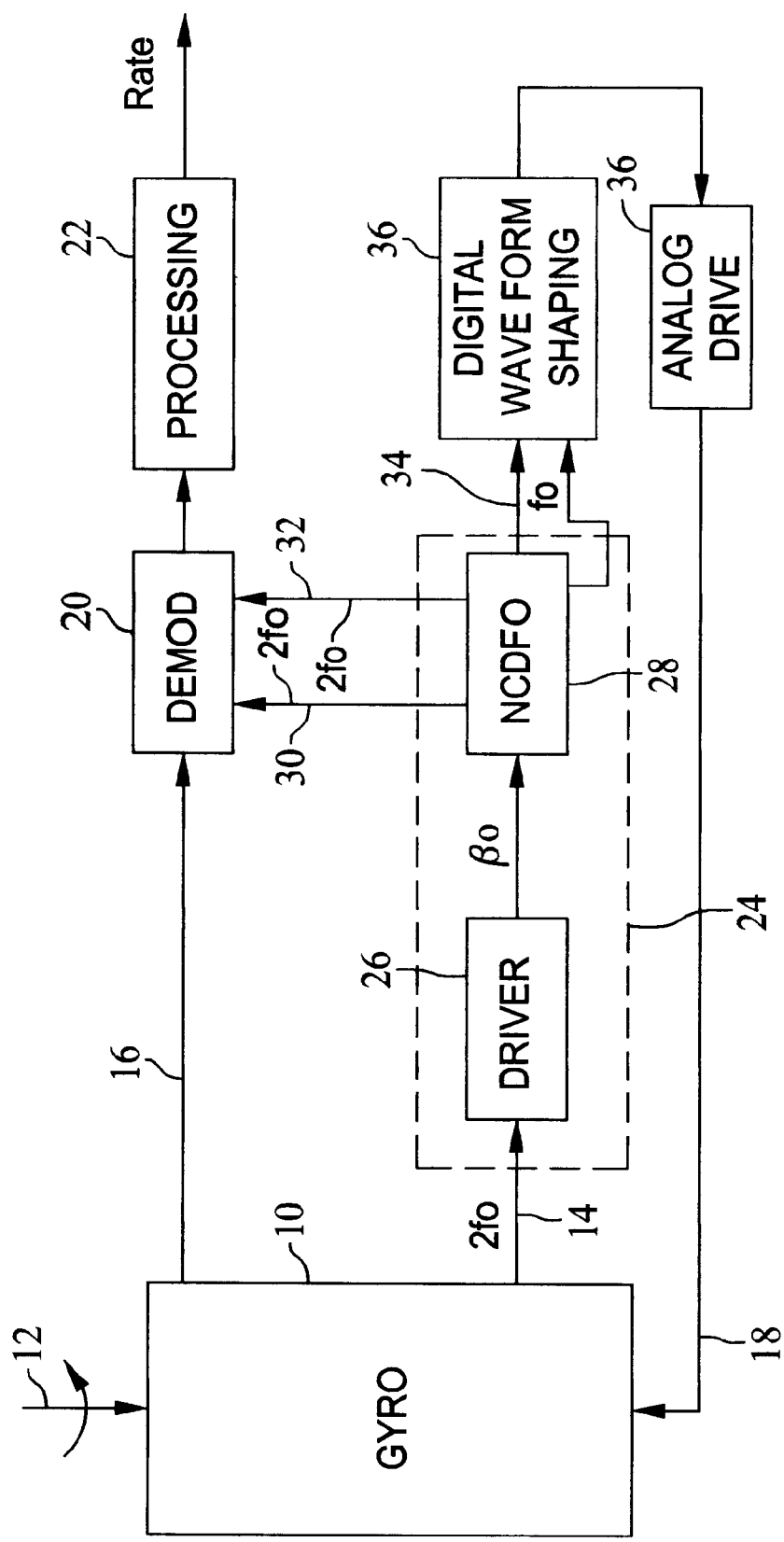
FIG. 1 is block diagram of a gyro based rate sensing system.

As shown in FIG. 1, a gyro 10 is responsive to an angular rate input 12 to provide output signals 14 and 16. The output signal 14 is a sampled sinusoidal carrier signal having a frequency equal to $2f_0$, where $f_0$ is the frequency of an analog motor drive signal 18 applied to the gyro 10. The output signal 16 is a sampled double sideband suppressed carrier (DSSC) modulation of angular rate input 12 and contains angular input rate information. Output signal 16 is demodulated by a demodulator 20 to recover angular input rate information, and is further processed by a signal processor 22 which supplies a load device, for example, a flight control computer.

Output signal 14 is detected by a phase locked loop 24 comprised of a driver 26 and a numerically controlled digital dual frequency oscillator 28. Driver 26, in one embodiment, includes an automatic gain control (AGC) circuit (shown in FIGS. 2 and 3). Driver 26 receives output signal 14 from gyro 10 and provides a frequency controlling signal to numerically controlled digital dual frequency oscillator 28. Numerically controlled digital dual frequency oscillator 28 responds to the frequency controlling signal by supplying demodulation reference signals 30 and 32 each at the frequency $2f_0$ to the demodulator 20. Oscillator 28 also supplies a motor control signal 34 at the frequency $f_0$ to a motor control signal conditioner 36 which, in turn, provides the analog motor drive signal 18 to the gyro 10.

Figure 2:
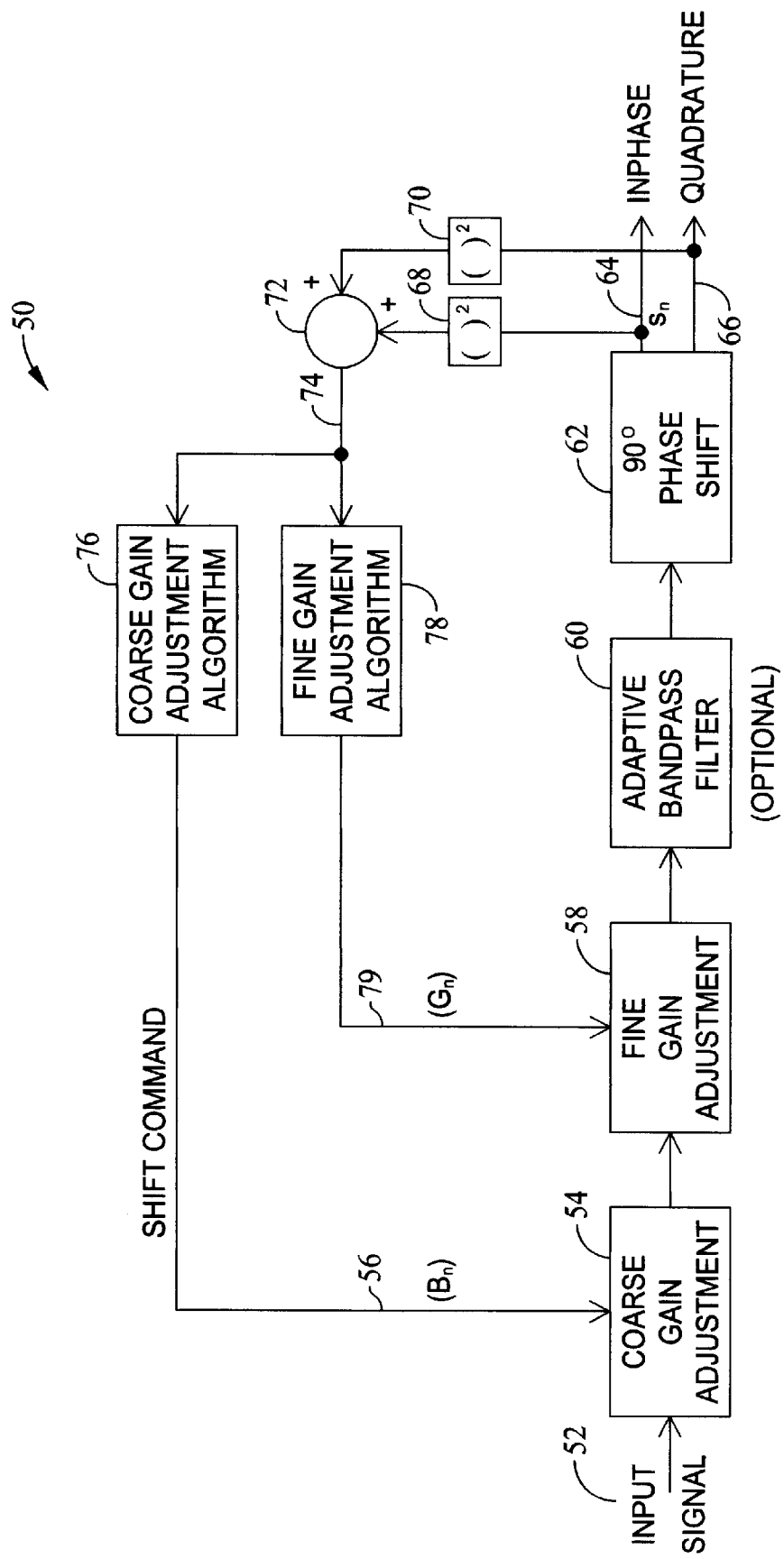
FIG. 2 is a block diagram of an automatic gain control (AGC) circuit used in the rate sensing system of FIG. 1.

FIG. 2 is a simplified block diagram of an automatic gain control (AGC) 50 which provides a tightly controlled, in amplitude, sinusoidal and cosinusoidal outputs to a phase detector of a phase locked loop, as described above, in order to tightly control servo gain within the PLL. An input signal 52 to AGC 50 is connected to a coarse gain adjustment 54 which scales input signal 52 by an amount corresponding to a shifting signal 56. A signal from coarse gain adjustment 54 is connected to a fine gain adjustment 58 which provides a smoothly ranging gain. Together, coarse gain adjustment 54 and fine gain adjustment 58 provide a two stage gain adjuster which provides a gain adjusted signal. An optional adaptive band pass filter 60 (described below in FIG. 10) receives a signal from fine gain adjustment 58. The filtered (or non-filtered) gain adjusted signal is applied to a 90 degree phase shift circuit 62 which provides two output signals 64 and 66 which are separated in phase by 90 degrees. For example, if signal 66 is $\sin(\theta)$, then signal 64 is $\cos(\theta)$. Such signals are sometimes referred to as quadrature pairs.

To provide control, signal 64 is squared by a squaring element 68 and signal 66 is squared by a second squaring element 70. An adder 72 sums the outputs of squaring elements 68 and 70 to estimate power of output signals 64 and 66. Elements 68 and 70, with adder 72 provide a power estimation unit for estimating the power of output signals 64 and 66. An output signal 74 from adder 72, representative of the power of output signals 64 and 66, is input into each of a coarse gain adjustment algorithm 76 and a fine gain adjustment algorithm 78. Coarse gain adjustment algorithm 76 senses a power of output signal 74 and provides shifting signal 56 to coarse gain adjustment 54 which is used to coarsely adjust the gain of coarse gain adjustment 54. Fine gain adjustment algorithm 78 senses a value of output signal 74 and provides a constrained signal 79 to fine gain adjustment 58 which is used to finely adjust the gain of fine gain adjustment 54. Together, coarse gain adjustment algorithm 76 and fine gain adjustment algorithm 78 provide an adjusting unit to adjust the gain at the two stage gain adjuster. In one embodiment, and as further described below, constrained signal 79 is constrained to a maximum value of one and a minimum value of negative one-half.

Figure 3:
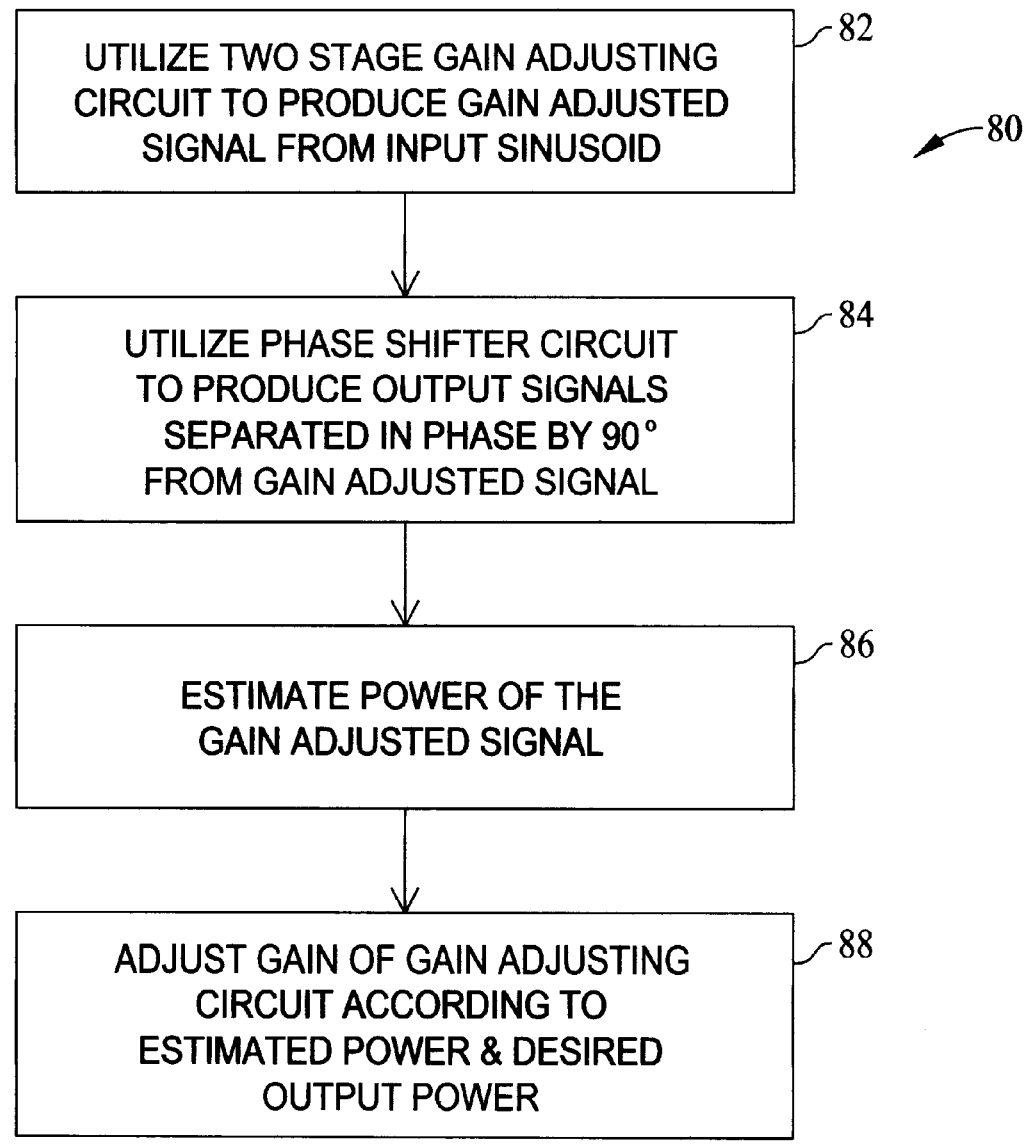
FIG. 3 is a flowchart illustrating a method embodied in the AGC circuit of FIG. 2.

FIG. 3 is a flowchart 80 illustrating a method for providing amplitude control for a signal input to circuit 50 (shown in FIG. 2). A two stage gain adjuster is utilized to produce 82 a gain adjusted signal from an input sinusoid. The gain adjusted signal is applied to 90 degree phase shift circuit to produce 84 two output signals which are separated in phase by 90 degrees. A power of the separated in phase output signals is estimated 86. Finally, the estimated power and a desired output power are used to adjust 88 the gain of the two stage gain adjuster.

Figure 4:
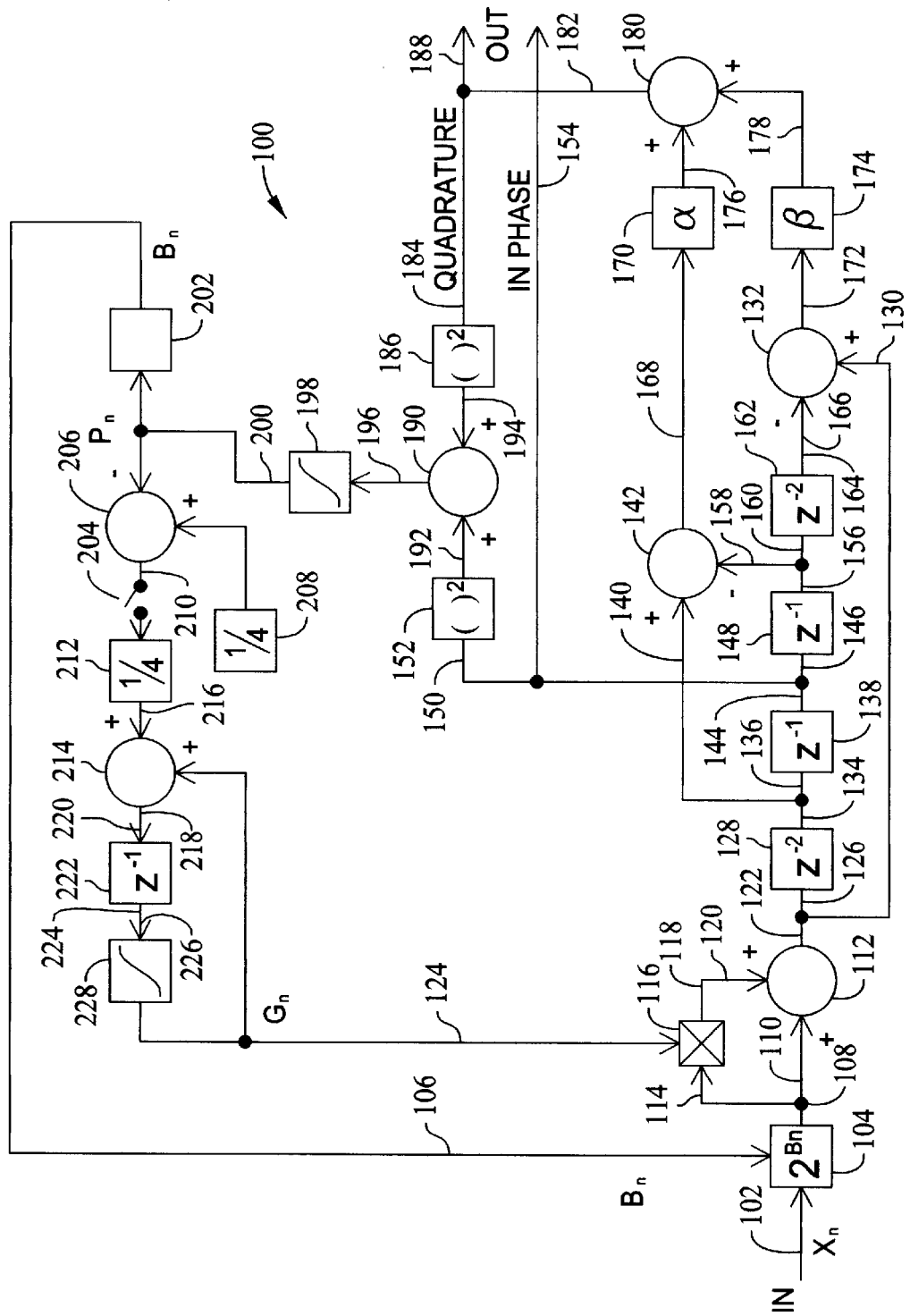
FIG. 4 is a detailed block diagram of the AGC circuit of FIG. 2.

FIG. 4 is a detailed block diagram of an automatic gain control (AGC) circuit 100. Circuit 100 is one embodiment of AGC 50 (shown in FIG. 2) which is configured to control a digitized sinusoidal signal of rapidly and widely varying amplitude. Referring specifically to circuit 100, input signal 102 is connected to bit shifter 104 which scales (multiplies) input signal 102 by an amount $2^{Bn}$ by right-shifting or left-shifting signal 102 which is received from an ADC (not shown). Scaling by a factor of $2^{Bn}$, or power of two, is considered herein to be a coarse gain adjustment controlled by a shift control signal $B_n$ 106 applied to shifter 104. A signal 108 received from bit shifter 104 is connected, with a unity gain, to a first input 110 of first adder 112 and a first input 114 of variable gain multiplier 116 whose output 118 is connected to a second input 120 of first adder 112. Multiplier 116 and first adder 112 form a linear gain stage capable of providing a gain ranging smoothly from a minimum of one-half to a maximum of two. Output 122 from first adder 112 is a gain controlled output sinusoidal signal whose amplitude lies between one-half and negative one-half. Multiplier 116 receives a gain control signal $G_n$ 124 which ranges between negative one-half and positive one.

Gain controlled signal from output 122 is applied to an input 126 of a first two sample period delay element 128 and an additive input 130 of a first subtractor 132. An output 134 of first two sample period delay element 128 is connected to an input 136 of a first single sample period delay element 138 and an additive input 140 of second subtractor 142. An output 144 of first single sample period delay element 138 is connected to an input 146 of a second single sample period delay element 148, an input 150 of a first squaring element 152, and an "in phase" output point 154. An output 156 of second single sample period delay element 148 is connected to a subtractive input 158 of second subtractor 142 and to an input 160 of a second two sample period delay element 162. An output 164 of second two sample period delay element 162 is connected to a subtractive input 166 of first subtractor 132.

An output 168 of second subtractor 142 is scaled by first coefficient a, in first scaling element 170. In one specific embodiment, said first coefficient a in first scaling element is 0.5676666983. An output 172 of first subtractor 132 is scaled by a second coefficient, $\beta$, in a second scaling element 174. In one specific embodiment, said second coefficient, $\beta$, in second scaling element 174 is 0.0679668994.

An output 176 of first scaling element 170 and an output 178 of second scaling element 174 are summed in second adder 180 whose output 182 is connected to an input 184 of second squaring element 186 and "quadrature" output point 188. Elements 128, 138, 148, 162, 132, 142, 170, 174, and 180 comprise a two multiplier Hilbert transformer whose outputs 154 and 188 are out of phase, by 90 degrees. For example, if signal at 154 is $\sin(\theta)$, then signal 188 is $\cos(\theta)$. The Hilbert transformer described herein provides less than −60 dB of amplitude error for a signal whose input frequency lies anywhere in the range from 8 kHz to 12 kHz with a sampling frequency of 39.6 kHz.

A third adder 190 sums an output 192 of first squaring element 152 and an output 194 of second squaring element 186. An output 196 of adder 190 is applied to a first limiter 198 which constrains an output 200 of limiter 198 to unity and provides a power estimation signal, $P_n$, for gain control. A logic and control unit 202 senses a value of the power estimation signal $P_n$ (output 200) and a level of gain control signal $G_n$ 124 and counts a system clock according to nMOD16. Logic and control unit 202 provides shift control signal $B_n$ 106, which, assuming that an initial condition $B_0$ is zero, is calculated as follows:

increment $B_n$ if [($P_n$<$\frac{1}{16}$) OR ($G_n$=1)] AND (nMOD16= 0), and decrement $B_n$ if [($P_n$=1) OR ($G_n$=-½)] AND (nMOD16= 0), which results in coarse gain control. nMOD16 is a control signal which is true once every sixteen clock periods.

In one embodiment, logic and control unit 202 also provides an open/close command signal (not shown) for switch 204. The command signal closes switch 204 if estimated power, $P_n$ is greater than or equal to $\frac{1}{16}$ and less than one, otherwise switch 204 is open. When switch 204 is closed, fine gain control is enabled.

A third subtractor 206 subtracts power estimation signal $P_n$ (output 200) from a constant element 208, which is a desired output signal power. In one embodiment, constant element 208 has a value of ¼. Switch 204, when closed, connects an output 210 of third subtractor 206 to a fixed scaling element 212 which, in one embodiment, divides by four, output 210 of third subtractor 206. A fourth adder 214 sums an output 216 of fixed scaling element 212 with gain control signal $G_n$ 124. An output 218 of fourth adder 214 is connected to an input 220 of a third single sample period delay element 222 whose output 224 is connected to an input 226 of a second limiter 228. The output of second limiter 228 is gain control signal $G_n$ 124 and is constrained to a maximum value of one and a minimum value of negative one-half, as described above. Fourth adder 214, third single sample period delay element 222, and second limiter 228 are connected, in one embodiment, as a saturating accumulator.

Figure 5:
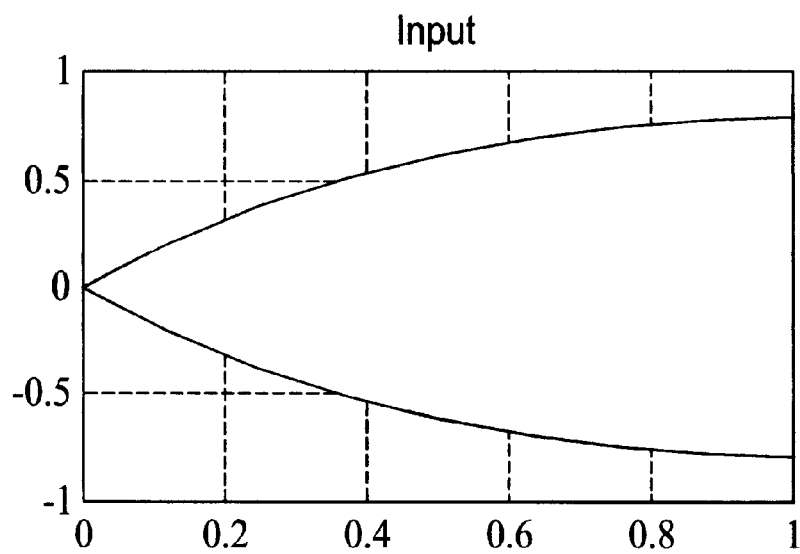
FIG. 5 is an illustration of an input signal to the circuit of FIG. 4.
Figure 6:
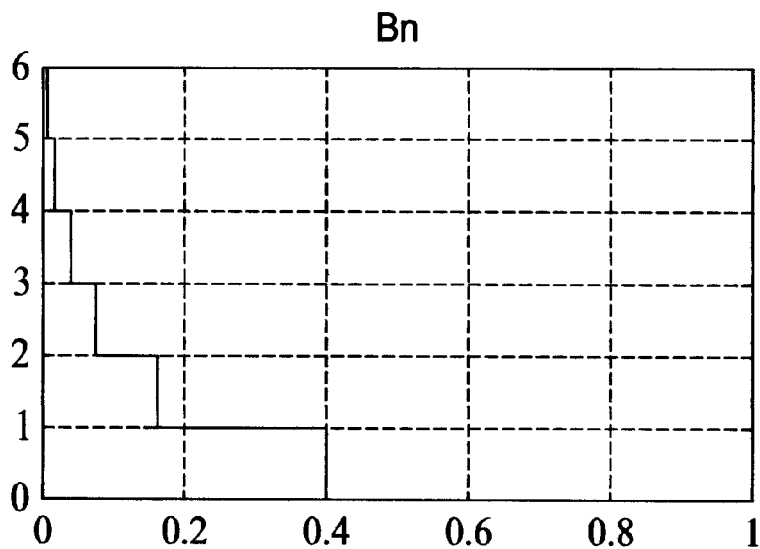
FIG. 6 is an illustration of a shift control signal generated within the circuit of FIG. 4.
Figure 7:
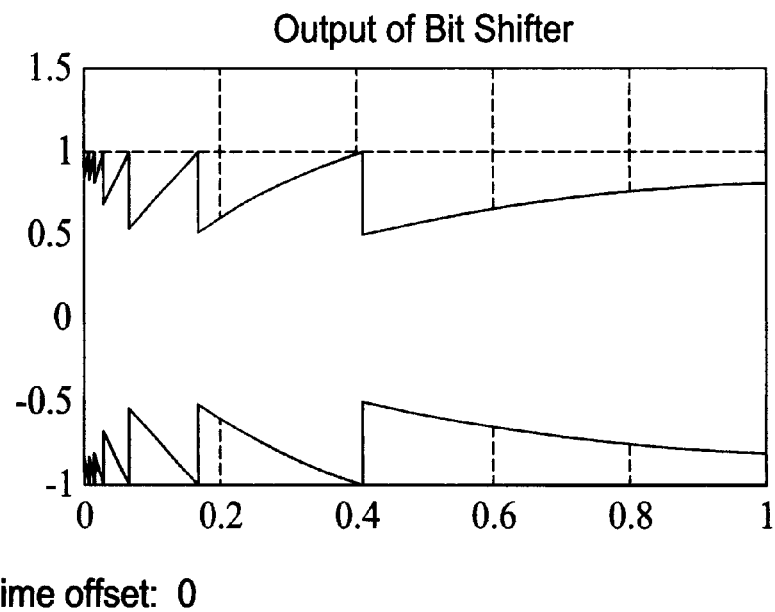
FIG. 7 is an illustration of an output signal from a bit shifter generated within the circuit of FIG. 4.
Figure 8:
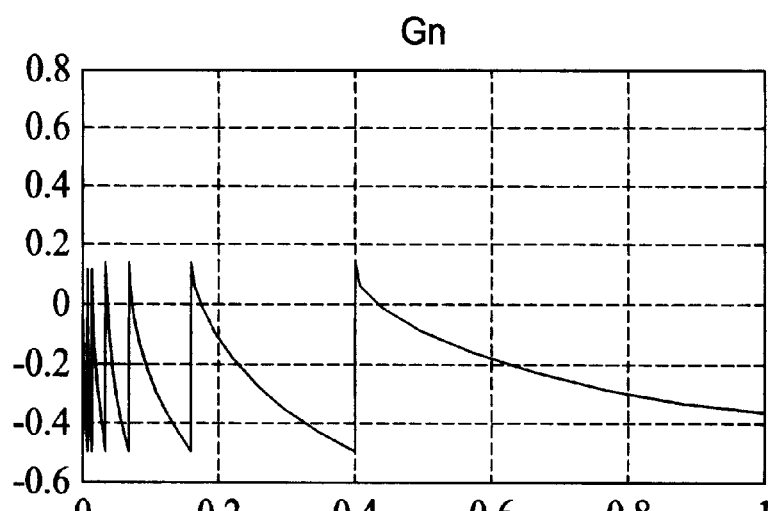
FIG. 8 is an illustration of a fine gain control signal generated within the circuit of FIG. 4.
Figure 9:
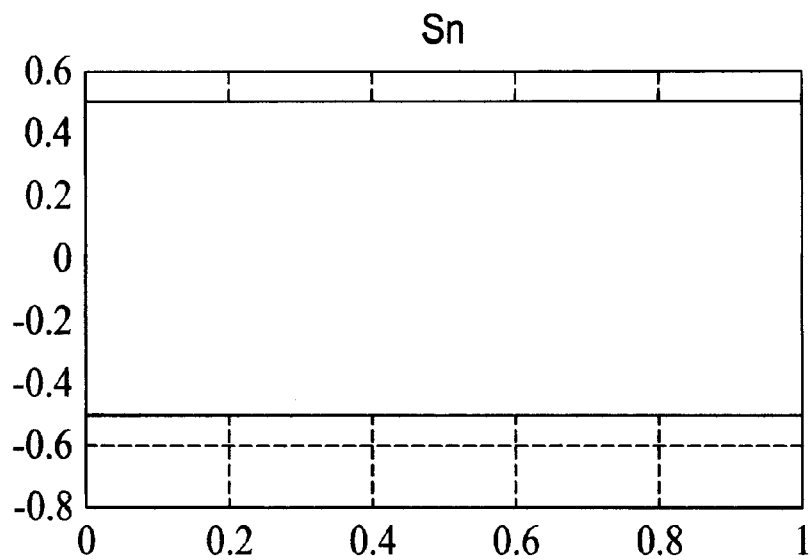
FIG. 9 is an illustration of an output signal from the circuit of FIG. 4.
Figure 10:
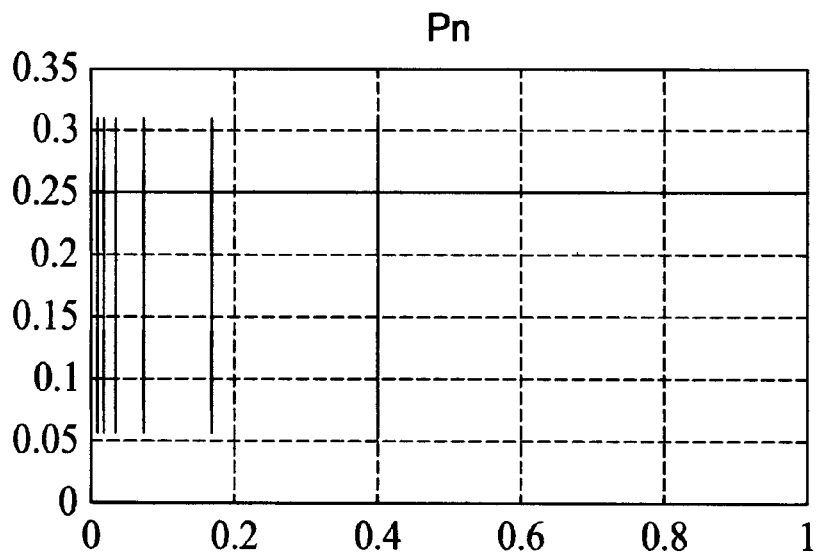
FIG. 10 is an illustration of an estimated power signal generated within the circuit of FIG. 4.

FIGS. 5 through 10 are depictions of oscilloscope displays which illustrate operation of AGC circuit 100 (shown in FIG. 4). Referring to FIG. 5, an input signal $x_n$, a sinusoid of rapidly changing amplitude is applied to AGC circuit 100. FIG. 6 is an illustration of a change in shift control signal 106, $B_n$, which is a shifting bit value, based upon a power estimate of output signal 200 (shown in FIG. 4). Bit shifting provides circuit 100 with a coarse gain adjustment. FIG. 7 is an illustration of signal 108 (described in FIG. 4) which is an output of bit shifter 104 (shown in FIG. 4). Bit shifter output is a multiplication of the bit shift value and the input signal $x_n$. FIG. 8 is an illustration of a fine gain control signal $G_n$, 124 (described above in FIG. 4). FIG. 9 is a representation of one of signals 122, 154, or 188 from circuit 100. The output is controlled in amplitude, and is based on the input signal $x_n$ (shown in FIG. 5). FIG. 10 is an illustration of estimated power signal 200, calculated as described above in FIG. 4.

Figure 11:
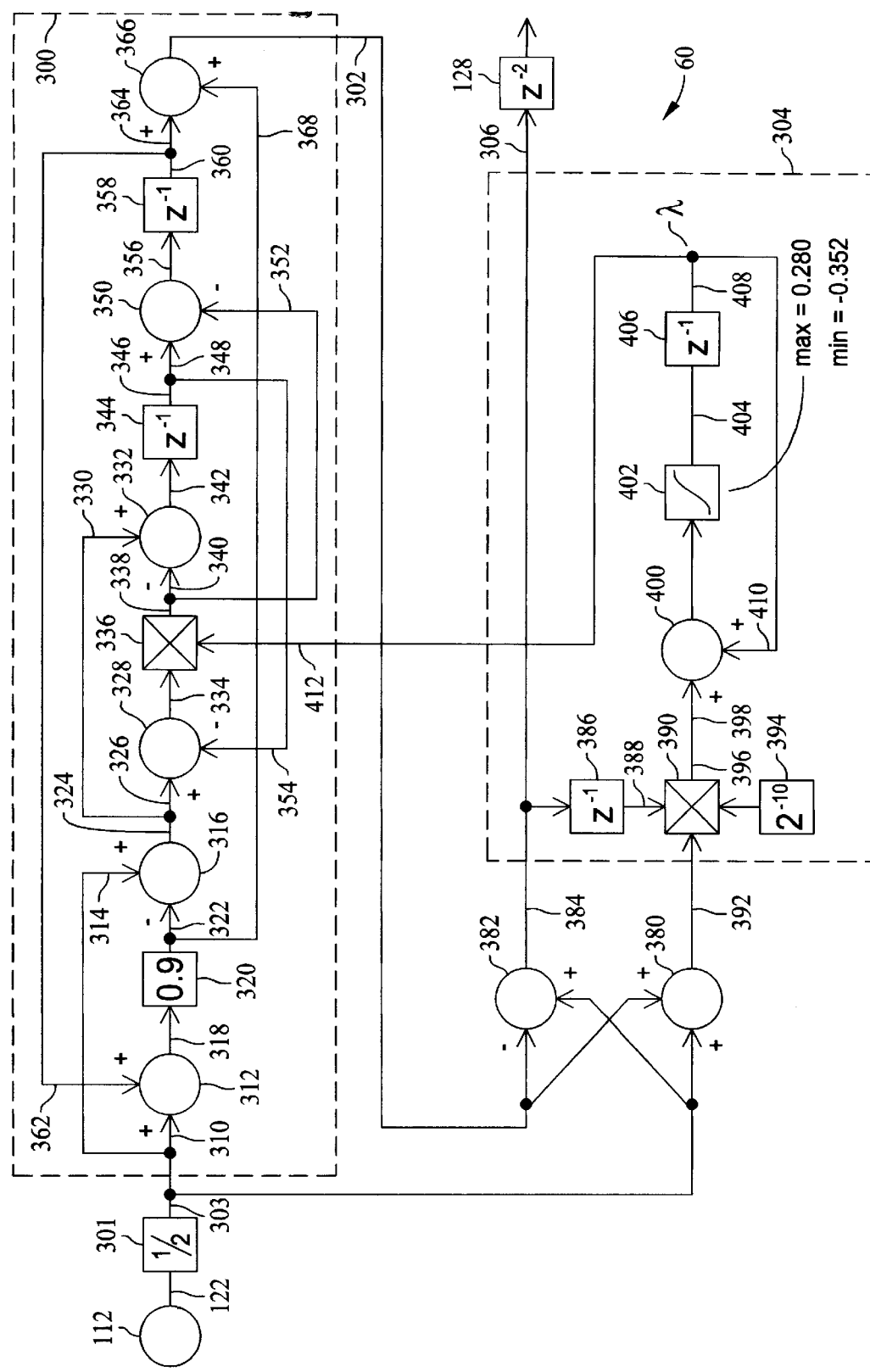
FIG. 11 is a block diagram of an adaptive bandpass filter.

FIG. 11 is a block diagram of one embodiment of optional adaptive bandpass filter 60 (also shown in FIG. 2). The embodiment is illustrated in FIG. 11 as connected to components of AGC circuit 100 (shown in FIG. 4). Filter 60 includes a tunable allpass filter 300 which receives as its input, a scaled output from first adder 112 (shown in FIG. 4), the scaling provided by a scaling element 301. Scaling element 301 applies a gain of one-half to output 122 of first adder 112. An output 303 of scaling element 301 is connected to an input of tunable allpass filter 300 and an input of adder 380. The input (output 303 of scaling element 301) to tunable allpass filter 300 and an output 302 from tunable all pass filter 300 are summed in adder 380 and differenced in subtractor 382 (both described further below) to provide a pair of power complementary outputs which are a bandstop and a bandpass signal pair. The power complementary outputs drive a circuit 304 that computes a tuning parameter, coefficient λ. Bandpass output 306 is input to a 90 degree phase shift circuit, partially shown as first two sample period delay element 128 (also shown in FIG. 4).

Referring specifically to tunable allpass filter 300, an output 122 is scaled by scaling element 301. Output 303 from scaling element 301 is connected to an input 310 of adder 312 and at an input 314 of subtractor 316. Output 318 of adder 312 is scaled by scaling element 320, which, in one embodiment, has a value of 0.9, and is received at an input 322 of subtractor 316. Output 324 of subtractor 316 is received at input 326 of second subtractor 328 and at an input 330 of third subtractor 332. Output 334 of second subtractor 328 is received at multiplier 336, whose output 338 is an input 340 to third subtractor 332. Output 342 of third subtractor 332 is received by delay element 344 whose output 346 is received at an input 348 of fourth subtractor 350. A second input 352 to fourth subtractor 350 is output 338 of multiplier 336. A second input 354 to second subtractor 328 is output 346 of delay element 344. Output 356 of fourth subtractor 350 is received by delay element 358, whose output 360 is received as a second input 362 to adder 312 and as an input 364 to second adder 366. A second input 368 to adder 366 is the output of scaling element 320. Second adder 366 provides output 302.

Referring specifically to circuit 304, power complementary outputs (output 122 and output 302) are generated by summing input 122 to tunable all pass filter 300 and output 302 from tunable allpass filter 300 in adder 380 and determining a difference of input subtractor 382. Output 384 of adder 382 is output 306 which is routed to 90 degree phase shift circuit as described above. Output 384 further is received by a delay element 386 whose output 388 is received by multiplier 390. Also received as inputs to multiplier 390 is an output 392 of adder 380 and a scaling element 394. In one embodiment, scaling element 394 has a value of $2^{-10}$. Output 396 of multiplier 390 is received as an input 398 to adder 400. Output of adder 400 is received by limiter 402. In one embodiment, limiter 402 has a maximum output value of 0.280 and a minimum output value of −0.352. Output 404 of limiter 402 is received by delay element 406 whose output is the tuning parameter λ, which is received as an input 410 to adder 400 and as an input 412 to multiplier 336.

The methods and circuits described herein for automatic gain control (AGC) therefore provide tightly amplitude controlled sinusoid and cosinusoid output waveforms, which when used for gyro control, are provided to a phase detector of a phase-locked loop. The waveforms are tightly controlled in amplitude even though an analog-to-digital converter (ADC) which provides an input to the AGC circuit operates with a very wide dynamic operating range.

While the invention has been described in terms of various specific embodiments, those skilled in the art will recognize that the invention can be practiced with modification within the spirit and scope of the claims.

What is claimed is:

1. An apparatus for controlling an amplitude of a signal generated from a digitized sinusoid of rapidly and widely varying amplitude, said apparatus comprising:
    a two stage gain adjuster which produces a gain adjusted signal;
    a phase shifter which converts the gain adjusted signal into two gain adjusted output signals separated in phase by 90 degrees;
    a power estimation unit to estimate the power of the gain adjusted signal; and
    an adjusting unit to adjust a gain of said gain adjuster according to a power estimate from said power estimation unit and a desired output signal power.

2. An apparatus according to claim 1 wherein said gain adjuster comprises:
    a first stage configured to provide coarse gain changes; and
    a second stage configured to provide fine gain changes.

3. An apparatus according to claim 2 wherein said first stage is configured to provide power of two gain changes utilizing a bit shifter for gain adjustment.

4. An apparatus according to claim 3 wherein said bit shifter is configured to allow one bit increase or decrease per adjustment cycle.

5. An apparatus according to claim 4 wherein said first stage of said gain adjuster is configured to shift a current gain factor one bit left when the power estimate of the gain adjusted signal is equal to or less than one-fourth of the desired output signal power.

6. An apparatus according to claim 4 wherein said first stage of said gain adjuster is configured to shift a current gain factor one bit right when the power estimate of the gain adjusted signal is equal to or greater than four times the desired output signal power.

7. An apparatus according to claim 4 wherein said adjusting unit to adjust a gain of said gain adjuster is configured to adjust a shift control signal $B_n$ at said bit shifter according to:

increment $B_n$ if [($P_n$<1/16) OR ($G_n$=1)] AND (nMOD16=0), and decrement $B_n$ if [($P_n$=1) OR ($G_n$=-1/2)] AND (nMOD16=0), where nMOD16 is true once every sixteen clock periods, $P_n$ is an estimated power of an output signal, and $G_n$ is a fine gain control signal input to said second stage of said gain adjuster.

8. An apparatus according to claim 2 wherein said second stage of said gain adjuster is configured to sum an input signal at unity gain with a signal which is the input signal multiplied by a variable gain.

9. An apparatus according to claim 8 wherein said second stage of said gain adjuster is configured to provides gain changes between one-half and two to the input signal.

10. An apparatus according to claim 8 wherein the variable gain is adjustable between negative one-half and positive one.

11. An apparatus according to claim 8 wherein said adjusting unit to adjust a gain of said gain adjuster comprises a saturating accumulator configured to adjust the variable gain of said second stage of said gain adjuster.

12. An apparatus according to claim 11 wherein said saturation accumulator is configured with saturation limits from negative one-half to positive one.

13. An apparatus according to claim 1 wherein said phase shifter comprises a Hilbert transformer.

14. An apparatus according to claim 13 wherein said phase shifter is configured to provide a gain error which is less than −60 dB between the two gain adjusted output signals output from said Hilbert transformer over a full frequency range of the input signal to said Hilbert transformer.

15. An apparatus according to claim 1 wherein said power estimation unit is configured to:

square the two gain adjusted signals output from said phase shifter; and sum the two squared signals.

16. An apparatus according to claim 15 wherein said power estimation unit is configured to limit the signal power estimate to unity.

17. An apparatus according to claim 1 wherein the desired output signal power is a constant, and the power estimate is subtracted from the desired output signal power to produce a power error signal.

18. An apparatus according to claim 17 wherein the desired output signal power is 1/4.

19. An apparatus according to claim 17 wherein said adjusting unit to adjust a gain of said gain adjuster comprises a saturating accumulator, wherein an input to said saturating accumulator is the power error signal.

20. An apparatus according to claim 19 further comprising:

a control switch; and a gain element, wherein the power error signal is coupled to the input of said saturating accumulator through said control switch and said gain element.

21. An apparatus according to claim 20 wherein said control switch is closed when the power estimate is less than one and equal to or greater than 1/16.

22. An apparatus according to claim 21 wherein said gain element has a gain of one-fourth.

23. An apparatus for controlling an amplitude of a signal generated from a digitized sinusoid signal of rapidly and widely varying amplitude, said apparatus comprising:

a two stage gain adjuster which produces a gain adjusted signal;

an adaptive filter which filters the gain adjusted signal;

a phase shifter which converts the filtered gain adjusted signal into two filtered gain adjusted output signals separated in phase by 90 degrees;

a power estimation unit to estimate the power of the filtered gain adjusted signal; and an adjusting unit to adjust a gain of said gain adjuster according to a power estimate from said power estimation unit and a desired output signal power.

24. An apparatus according to claim 23 wherein said adaptive filter is configured to generate power complementary signals which comprise a bandstop signal and a bandpass signal.

25. A method for controlling the amplitude of a signal generated from a digitized sinusoid signal of rapidly and widely varying amplitude, said method comprising:

producing a gain adjusted signal from the sinusoid utilizing a two stage gain adjuster;

converting the gain adjusted signal into two gain adjusted output signals separated in phase by 90 degrees utilizing a phase shifter;

estimating the power of the gain adjusted signal; and adjusting the gain of the gain adjuster according to the estimated power and a desired output signal power.

26. A method according to claim 25 wherein producing a gain adjusted signal from the sinusoid comprises:

configuring a first stage of the adjuster to provide coarse gain changes; and configuring a second stage of the adjuster to provide fine gain changes.

27. A method according to claim 26 wherein configuring a first stage of the adjuster comprises providing power of two gain changes utilizing a bit shifter.

28. A method according to claim 27 further comprising limiting the bit shifter one bit shift per adjustment cycle.

29. A method according to claim 26 wherein configuring a second stage of the adjuster comprises limiting gain of the second stage to be between one-half and two times the input signal.

30. A method according to claim 26 wherein adjusting the gain of the gain adjuster comprises configuring a saturating accumulator to limit the gain of the second stage to between negative one-half and positive one.

31. A method according to claim 26 further comprising shifting a current gain factor of the first stage of the adjuster one bit left when a power estimate of the gain adjusted signal is equal to or less than one-fourth of the desired output signal power.

32. A method according to claim 26 further comprising shifting a current gain factor of the first stage of the adjuster one bit right when the power estimate of the gain adjusted signal is equal to or greater than four times the desired output signal power.

33. A method according to claim 26 further comprising producing a power error signal which is the estimated power subtracted from the desired output signal power.

34. A method according to claim 33 wherein adjusting the gain of the second stage of the gain adjuster comprises using the power error signal to adjust the gain of the second stage.

35. A method according to claim 34 further comprising switching the power error signal from the second stage when the estimated power is less than 1/16 and equal to or greater than one.

36. A method according to claim 25 wherein converting the gain adjusted signal into two gain adjusted output signals separated in phase by 90 degrees comprises converting the gain adjusted signal utilizing a Hilbert transformer.

37. A method according to claim 36 further comprising configuring the Hilbert transformer to provide a gain error which is less than −60 dB between the two gain adjusted output signals.

38. A method according to claim 25 wherein estimating the power of the gain adjusted signal comprises:
   squaring the two gain adjusted signals from the phase shifter; and
   summing the two squared signals.

39. A control circuit for a gyro comprising:
   a phase-locked loop (PLL) configured to supply a motor control signal, said PLL further comprising:
      an analog-to-digital converter (ADC) configured to receive a gyro pick-off signal;
      an automatic gain control (AGC) circuit to provide amplitude control to an output of said ADC; and
      a numerically controlled digital dual frequency oscillator; and
   a motor signal conditioner which converts the motor control signal to an analog motor drive signal.

40. A control circuit according to claim 39 wherein said AGC circuit comprises:
   a two stage gain adjuster which produces a gain adjusted signal;
   a phase shifter which converts the gain adjusted signal into two gain adjusted output signals separated in phase by 90 degrees;
   a power estimation unit to estimate the power of the gain adjusted signal; and
   an adjusting to adjust a gain of said gain adjuster according to a power estimate from said power estimation unit and a desired output signal power.

41. A control circuit according to claim 40 wherein said two stage gain adjuster comprises:
   a first stage configured to provide coarse gain changes; and
   a second stage configured to provide fine gain changes.

* * * * *

UNITED STATES PATENT AND TRADEMARK OFFICE
CERTIFICATE OF CORRECTION

PATENT NO.    : 6,725,169 B2
DATED         : April 20, 2004
INVENTOR(S)   : Thielman et al.

It is certified that error appears in the above-identified patent and that said Letters Patent is hereby corrected as shown below:

Column 7,
Line 24, delete "provides" and insert -- provide --.

Signed and Sealed this

Twentieth Day of December, 2005

JON W. DUDAS
*Director of the United States Patent and Trademark Office*